United States Patent
Franca-Neto

(10) Patent No.: US 7,233,780 B2
(45) Date of Patent: *Jun. 19, 2007

(54) METHOD AND APPARATUS FOR PERFORMING DC OFFSET CANCELLATION IN A RECEIVER

(75) Inventor: Luiz M. Franca-Neto, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 515 days.

This patent is subject to a terminal disclaimer.

(21) Appl. No.: 10/785,783

(22) Filed: Feb. 24, 2004

(65) Prior Publication Data

US 2004/0166824 A1 Aug. 26, 2004

Related U.S. Application Data

(63) Continuation of application No. 09/712,453, filed on Nov. 14, 2000, now Pat. No. 6,697,611.

(51) Int. Cl.
*H04B 1/10* (2006.01)

(52) U.S. Cl. ............... 455/296; 455/306; 455/311; 375/319

(58) Field of Classification Search ............. 455/114.2, 455/114.3, 63.1, 295
See application file for complete search history.

(56) References Cited

U.S. PATENT DOCUMENTS

| | | | |
|---|---|---|---|
| 4,644,301 A | 2/1987 | Hecht | 333/101 |
| 5,293,169 A * | 3/1994 | Baumgartner et al. | 341/172 |
| 5,648,955 A | 7/1997 | Jensen et al. | 370/252 |
| 5,724,653 A | 3/1998 | Baker et al. | 455/296 |
| 6,009,124 A | 12/1999 | Smith et al. | 375/267 |
| 6,009,126 A * | 12/1999 | Van Bezooijen | 375/319 |
| 6,075,409 A | 6/2000 | Khlat | 329/304 |
| 6,100,827 A * | 8/2000 | Boesch et al. | 341/118 |
| 6,516,185 B1 | 2/2003 | MacNally | 455/234.1 |
| 6,516,187 B1 | 2/2003 | William et al. | 455/313 |
| 6,606,359 B1 * | 8/2003 | Nag et al. | 375/348 |
| 6,697,611 B1 * | 2/2004 | Franca-Neto | 455/296 |

(Continued)

FOREIGN PATENT DOCUMENTS

EP 1102413 A2 5/2001

*Primary Examiner*—Duc M. Nguyen
(74) *Attorney, Agent, or Firm*—Schwegman, Lundberg, Woessner & Kluth, P.A.

(57) ABSTRACT

An amplification system for reducing DC offset in an input signal uses a low pass filter to isolate a DC component of the input signal. The system then subtracts the DC component from the input signal. In one embodiment, the system includes first and second amplifiers in addition to the low pass filter. The first amplifier amplifies the input signal to generate a first amplified signal at a differential output port of the amplification system. The second amplifier amplifies a low pass filtered version of the input signal to generate a second amplified signal at the differential output port of the amplification system. The outputs of the first and second amplifiers are connected to the differential output port of the amplification system in such a way that the first and second signals combine 180 degrees out of phase at the output port. An automatic gain control circuit is also provided that automatically adjusts the gain of the amplification system without changing a bias level associated with the first and second amplifiers.

19 Claims, 3 Drawing Sheets

U.S. PATENT DOCUMENTS

| | | |
|---|---|---|
| 6,836,671 B2 * | 12/2004 | Haigh et al. ................. 455/561 |
| 7,102,978 B2 * | 9/2006 | Ogihara ................... 369/59.17 |
| 2004/0081256 A1 * | 4/2004 | Shi et al. .................... 375/317 |
| 2005/0107674 A1 * | 5/2005 | Parthasarathy et al. ..... 600/301 |
| 2005/0152554 A1 * | 7/2005 | Wu ............................... 381/1 |

* cited by examiner

METHOD AND APPARATUS FOR PERFORMING DC OFFSET CANCELLATION IN A RECEIVER

This application is a continuation of U.S. patent application Ser. No. 09/712,453, filed on Nov. 14, 2000, issued as U.S. Pat. No. 6,697,611 on Feb. 24, 2004, which is incorporated herein by reference.

FIELD OF THE INVENTION

The invention relates generally to amplifier circuits and, more particularly, to amplifier circuits for use within receiver systems.

BACKGROUND OF THE INVENTION

A common problem in radio frequency (RF) receivers is the presence of a direct current (DC) offset in the baseband signal that is generated after down conversion. This DC offset can compromise receiver performance by, among other things, overloading the baseband amplifiers in the receiver. The DC offset is particularly large in direct conversion receivers that convert an RF receive signal directly to baseband without an intervening intermediate frequency (IF) stage. In a direct conversion receiver, the local oscillator (LO) frequency is the same as or very close to the center frequency of the RF receive signal. In addition, the LO signal is typically much larger in magnitude than the RF signal. Some of this LO signal will normally leak into the RF port of the receive mixer and combine with the RF signal before down conversion occurs. This generally results in a large DC offset in the resulting baseband signal because the LO signal mixes with itself.

In the past, a number of different techniques have been used to reduce DC offset in the baseband signal. In one approach, the baseband signal was passed through a very large, series connected capacitor before being amplified. In this approach, the capacitor and the input impedance of the following amplification stage act as a high pass filter that is supposed to pass everything except DC. Such high pass filter designs, however, are typically plagued by parasitic capacitances that make the filters difficult to implement using very large scale integration (VLSI) techniques. For example, the input impedance required for the following stage will typically be unrealizable due to parasitic shunting capacitances associated with the input of the stage and/or the large, series capacitance.

In another approach, techniques have been developed that generate an imbalance in an otherwise balanced differential line to simulate a large series capacitance to block the DC component. These techniques have been relatively successful in blocking the DC offset, but the resulting imbalance has led to other problems in the receiver circuitry. For example, one of the reasons that a balanced, differential topology is used in circuits is because of the enhanced noise rejection (e.g., rejection of noise from the power supply leads) and even order harmonic distortion cancellation characteristics associated with the topology. By purposely creating an imbalance, part of this noise rejection and distortion cancellation capability is lost. In addition, other desirable qualities of balanced circuits may also be compromised using this approach.

DETAILED DESCRIPTION

Figure 1:
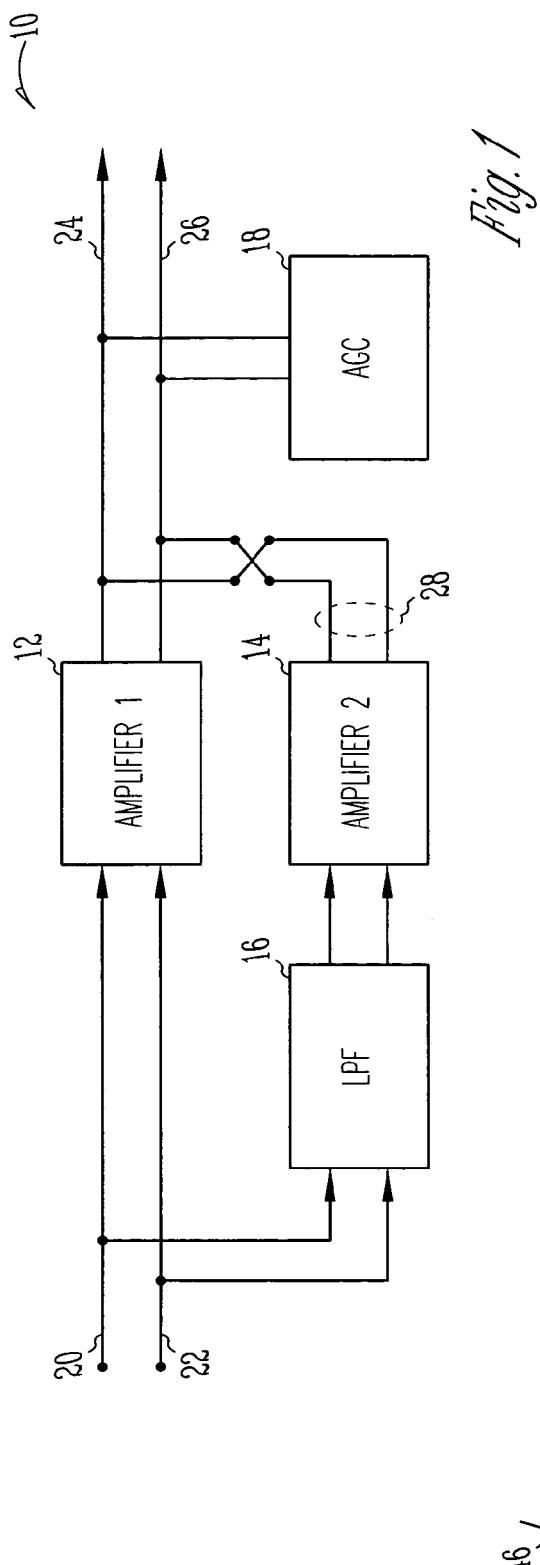
FIG. 1 is a block diagram illustrating an amplification system in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a system for suppressing DC offset within a communication signal. The system can be used, for example, to reduce or eliminate DC offset from the baseband signal in a receiver (e.g., a direct conversion receiver). Instead of using a high pass filter to remove the DC component of the baseband signal, the system uses a low pass filter to isolate the DC component of the signal which is then subtracted from the baseband signal itself Because a low pass filter is significantly easier to implement using very large scale integration (VLSI) techniques than a high pass filter, the system is more integration friendly than past designs. In one embodiment of the invention, a balanced amplification system is provided that includes first and second matched amplifiers in a parallel arrangement. The first amplifier amplifies an input signal having a DC offset component and delivers the resulting signal to a pair of differential output lines. The second amplifier amplifies a low pass filtered version of the same input signal and delivers the result to the pair of differential output lines in an inverted manner. Thus, the low pass filtered signal combines with the unfiltered signal 180 degrees out of phase on the output lines, and is thus subtracted therefrom. In one approach, the 180 degree phase shift is accomplished by cross-coupling the differential output terminals of the first and second amplifiers. Preferably, a low pass filter is used that rejects all but a very small frequency band about DC. In one embodiment of the invention, the amplification system includes an automatic gain control (AGC) circuit that automatically adjusts the gain of the system by variably loading the differential output lines. In this manner, the signal gain of the amplification system can be adjusted without changing the biasing of the system. This allows two or more amplification stages to be directly cascaded without having to adjust the bias of each stage separately.

FIG. 1 is a block diagram illustrating an amplification system 10 in accordance with one embodiment of the present invention. The amplification system 10 receives an input signal on the first and second differential input lines 20 and uses the input signal to generate a first amplified signal having reduced DC offset on the first and second differential output lines 24, 26. The amplification system 10 can be used, for example, as a baseband amplifier within a receiver to amplify a baseband signal generated by a mixer within the receive chain. As illustrated, the amplification system 10 includes: first and second amplifiers 12, 14; a low pass filter (LPF) 16; and an automatic gain control (AGC) unit 18. The first amplifier 12 receives the input signal from the first and second differential input lines 20, 22 and amplifies the signal to generate an amplified signal on the first and second differential output lines 24, 26. The LPF 16 also receives the input signal from the first and second differential input lines 20, 22 and filters the signal to reduce a high frequency content thereof. Preferably, the LPF 16 will block all but a very small frequency band about DC. The second amplifier 14 receives the filtered signal from the LPF 16 and amplifies it to generate a second amplified signal at an output 28 thereof. The output 28 of the second amplifier 14 is then cross-coupled to the first and second differential output lines 24, 26 of the amplification system 10 so that the second amplified signal combines with the first amplified signal 180 degrees out of phase. Consequently, the second amplified signal subtracts from the first amplified signal on the first and second differential output lines 24, 26. Because the second amplified signal had been low pass filtered, the signal is comprised primarily of an amplified version of the DC offset of the input signal. Thus, the DC offset within the first amplified signal will be suppressed on the first and second differential output lines 24, 26 by the action of the second amplified signal. As can be appreciated, the gain of the first and second amplifiers 12, 14 should be approximately equal to enhance cancellation of the DC offset on the first and second differential output lines 24, 26.

As illustrated, the optional AGC unit 18 is coupled across the first and second differential output lines 24, 26. The AGC unit 18 is configured to vary a shunt impedance between the two lines 24, 26 based on a signal level appearing on the lines. Thus, if a signal on one or both of the differential output lines 24, 26 is too high, the AGC 18 will increase the loading between the lines 24, 26 to reduce the output level of the system 10 to an acceptable level. The AGC 18, therefore, modifies the overall gain of the amplification system 10. Importantly, the AGC 18 adjusts the gain of the amplification system 10 without varying the bias levels used by the first and second amplifiers 12, 14. As will be discussed in greater detail, this feature greatly enhances the ability to cascade multiple amplification systems 10 within a receiver.

Figure 2:
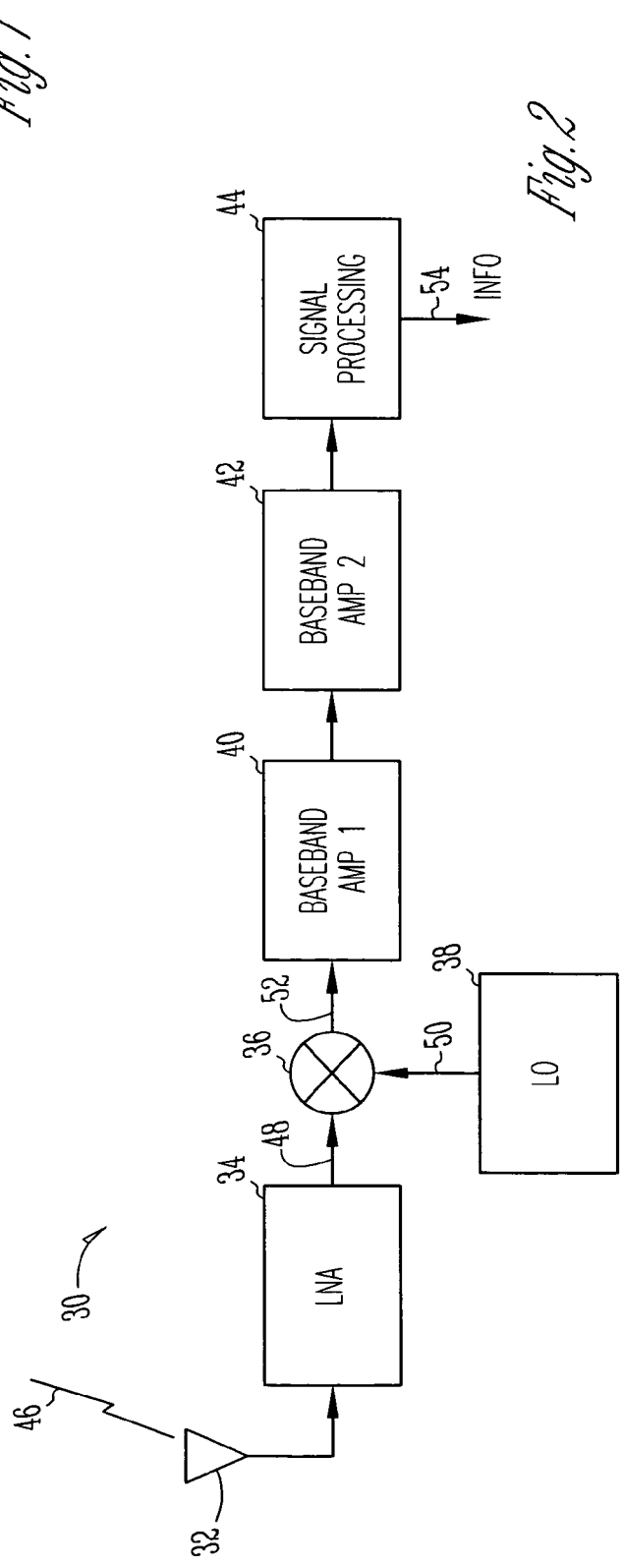
FIG. 2 is a block diagram illustrating a receiver system in accordance with one embodiment of the present invention.

FIG. 2 is a block diagram illustrating a receiver system 30 in accordance with one embodiment of the present invention. As illustrated, the receiver system 30 includes: a radio frequency (RF) antenna 32, a low noise amplifier (LNA) 34, a mixer 36, a local oscillator (LO) 38, first and second baseband amplification units 40, 42, and a signal processing unit 44. The RF antenna 32 receives a wireless RF signal 46 and delivers the signal to the input of the LNA 34. The LNA 34 amplifies the RF signal and delivers it to the RF port 48 of the mixer 36. The local oscillator 38 generates an LO signal and delivers it to the LO port 50 of the mixer 36. The mixer 36 uses the LO signal to down convert the RF signal to a baseband signal at the baseband port 52 of the mixer. As described previously, this is an example of a direct conversion receiver. It should be appreciated that the inventive principles can also be used within superheterodyne receivers having one or more intermediate frequency (IF) stages and also in other types of receivers. The first and second baseband amplification units 40, 42 are operative for amplifying the baseband signal to a level compatible with the signal processing unit 44. The signal processing unit 44 then processes the amplified baseband signal to extract useable information 54 from the signal.

The first and second baseband amplification units 40, 42 are each configured in accordance with the amplification system 10 of FIG. 1. Thus, each amplification unit 40, 42 amplifies the baseband signal while also suppressing a DC offset within the signal. The AGC unit 18 within the first baseband amplification unit 40 is configured so that an output signal of the unit 40 does not overdrive the first and second amplifiers of the second baseband amplification unit 42. In a similar manner, the AGC unit within the second baseband amplification unit 42 is configured so that an output signal of the second unit 42 does not exceed a maximum input level of the signal processing unit 44. As described previously, the AGC units 18 within the first and second baseband amplification units 40, 42 each adjust the signal gain of the respective stage without affecting the bias level at the output of the stage. In one approach, each amplification stage of a system uses the same bias level at both the input and the output of the stage. Thus, the output bias of one stage can be used as the input bias of the next stage. Because the AGC unit 18 of each stage does not effect the DC bias level on the output lines of the stage, the various stages can be directly cascaded one after another. It should be noted that capacitive coupling between the stages is undesirable as it will produce the same problems discussed previously with respect to the high pass filter approach. The number of baseband amplification stages that are cascaded within a receiver will generally depend upon the level of gain required within the baseband portion of the receiver and the gains of the individual amplification units.

Figure 3:
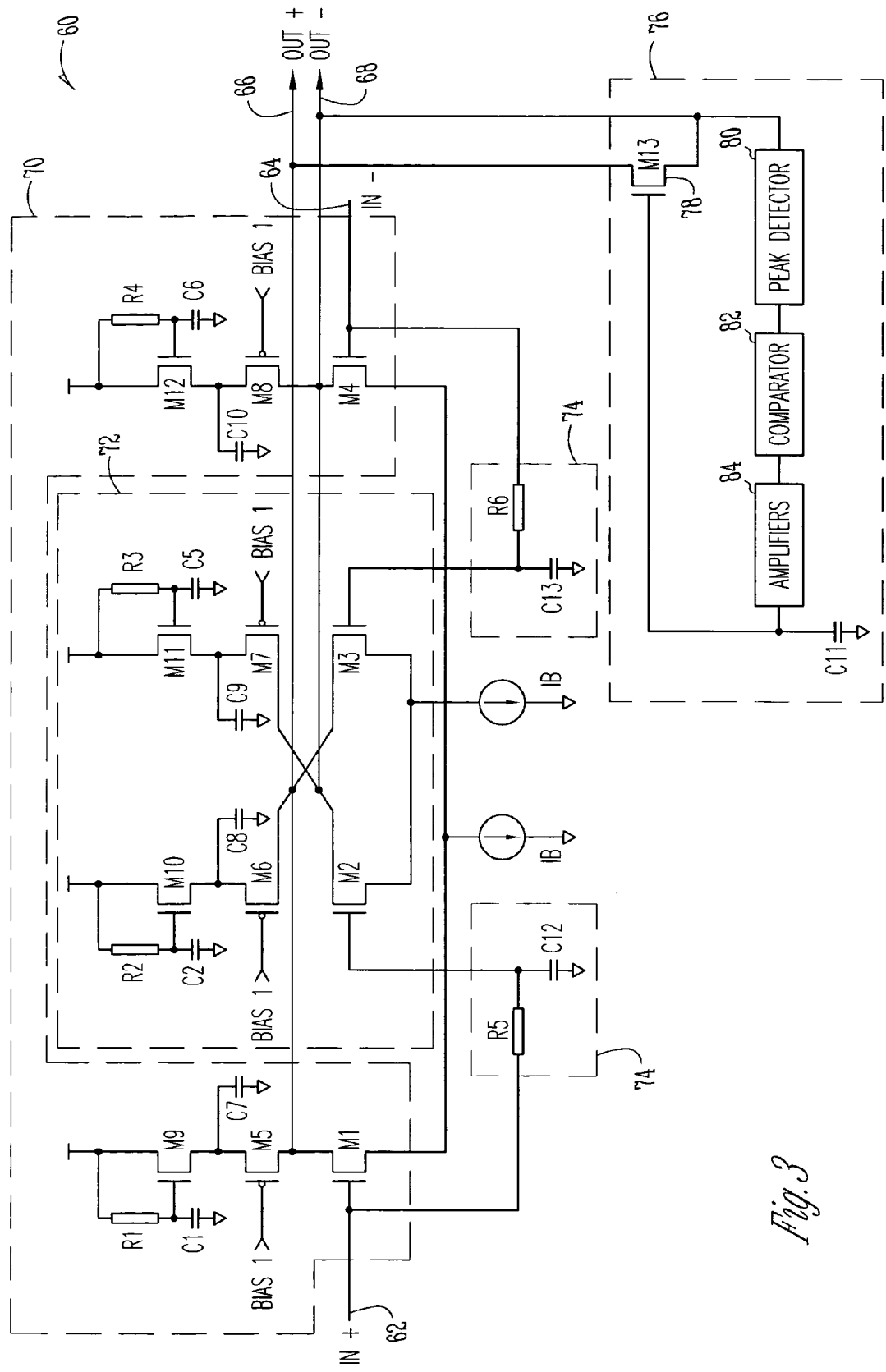
FIG. 3 is a schematic diagram illustrating an amplification circuit representing one possible implementation of the amplification system of FIG. 1.

FIG. 3 is a schematic diagram illustrating an amplification circuit 60 representing one possible implementation of the amplification system 10 of FIG. 1. The circuit 60 includes: a pair of differential input lines 62, 64; a pair of differential output lines 66, 68; first and second amplifiers 70, 72; an LPF 74; and an AGC unit 76. The first and second amplifiers 70, 72 are matched to one another and thus have substantially the same gain. In addition, the first and second amplifiers 70, 72 each include first and second matched portions for amplifying each of the corresponding differential input signal components. For example, the first amplifier 70 includes a first portion (having transistors M1, M5, and M9) to act upon the differential input signal component from the first differential input line 62 and a second portion (having transistors M4, M8, and M12) to act upon the differential input signal component from the second differential input line 64. Similarly, the second amplifier 72 includes a first portion (having transistors M2, M6, and M10) to act upon the differential input signal component from the first differential input line 62 and a second portion (having transistors M3, M7, and M11) to act upon the differential input signal component from the second differential input line 64. As illustrated, the output of the first portion of the first amplifier 70 is connected to the first differential output line 66 and the output of the second portion of the first amplifier 70 is connected to the second differential output line 68. Conversely, the output of the first portion of the second amplifier 72 is connected to the second differential output line 68 and the output of the second portion of the second amplifier 72 is connected to the first differential output line 66. Thus, the output signals of the first and second amplifiers 70, 72 will combine 180 degrees out of phase on the differential output lines 66, 68 and the DC offset will be reduced or eliminated.

The LPF 74 also includes first and second portions for handling the signal components on each of the differential input lines 62, 64, respectively. For example, a first portion includes a series resistor R5 and a shunt capacitor C12 for filtering a differential signal component on input line 62 and a second portion includes a series resistor R6 and a shunt capacitor C13 for filtering a differential signal component on input line 64. As described previously, the LPF 74 will preferably pass only a very small band of frequencies about DC. Consequently, the capacitors C12 and C13 need to have relatively high capacitances. A low pass filter (LPF) is typically much easier to implement using very large scale integration (VLSI) than a high pass filter (HPF). This is because the parasitic capacitances associated with the resistor and capacitor of the LPF can be used to help the low pass filtering in the VLSI design. This is not possible in a VLSI implemented HPF. Thus, the low pass filter 74 of FIG. 3 does not present the problems associated with the series-capacitance high pass filters of the prior art. Resistors R1–R4, capacitors C1–C10, and transistors M9–M12 provide high supply noise rejection.

The AGC unit 76 includes: a transistor 78, a peak detector 80, a comparator 82, a series of amplifiers 84, and a capacitor C11. The transistor 78 has first and second source/drain terminals each connected to a respective one of the first and second differential output lines 66, 68. By varying a voltage on the gate terminal of the transistor 78, therefore, the load on the differential output lines 66, 68 can be changed. The peak detector 80 measures a peak signal level on the second differential output line 68 and delivers an indication of the peak level to the comparator 82. The comparator 82 then compares the peak value to a reference value and outputs a signal related to the difference between the two values. The threshold value can include either an "implicit" reference level set by the toggling voltage of a skewed inverter or an "explicit" reference level inside the comparator 82. The amplifiers 84 amplify the output of the comparator 82 and deliver the result to the gate terminal of the transistor 78. In one approach, the amplifiers 84 includes a cascade of inverters that are biased for a maximum small signal gain. Capacitor C11 provides a very low frequency dominant pole in the AGC loop and also provides the integration action needed to ensure non-zero control signal for zero output level error to the desired output level. The AGC 76 allows the overall gain of the amplification circuit 60 to be automatically adjusted without varying the bias applied to the circuit 60 (e.g., $i_b$).

In one embodiment of the invention, the amplification circuit 60 of FIG. 3 is implemented using complementary metal-oxide-semiconductor (CMOS) techniques. Preferably, the entire circuit 60 will be implemented on a single semiconductor chip. In addition, the circuit 60 can be directly cascaded with one or more other amplification circuits 60 to achieve additional gain. These other amplification circuits can also be implemented on the same chip. Furthermore, additional receiver circuitry can also be implemented on the chip including, for example, a mixer and/or an LNA. All of the resistors and capacitors within the amplification circuit 60 can be implemented using MOS transistor structures.

Figure 4:
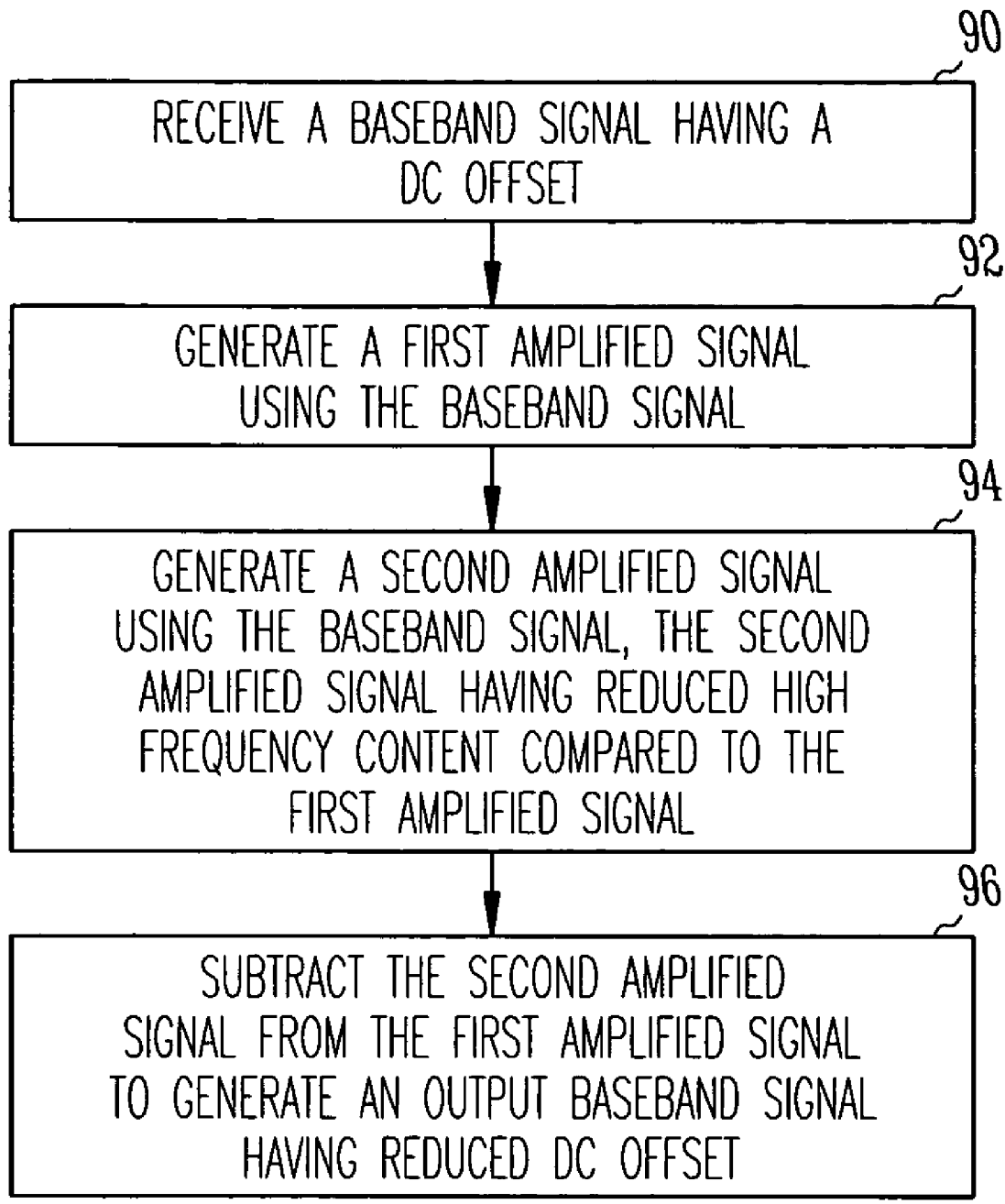
FIG. 4 is a flowchart illustrating a method for suppressing DC offset within a baseband signal in a receiver in accordance with one embodiment of the present invention.

FIG. 4 is a flowchart illustrating a method for suppressing DC offset within a baseband signal in a receiver. First, a baseband signal having a DC offset is received (block 90). A first amplified signal is then generated using the baseband signal (block 92). Typically, this will involve applying the signal to the input of an amplifier. A second amplified signal is also generated using the baseband signal (block 94). However, the second amplified signal has reduced high frequency content compared to the first amplified signal. The second amplified signal can be generated in a number of different ways. For example, the baseband signal can be low pass filtered and then amplified. Similarly, the baseband signal can be amplified and then low pass filtered. Alternatively, the second amplified signal can be generated by low pass filtering the first amplified signal. Preferably, the second amplified signal will be comprised predominantly of DC offset. The second amplified signal is then subtracted from the first amplified signal to generate an output baseband signal having reduced DC offset (block 96).

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A circuit comprising:
    a first amplifier to amplify a baseband signal having a DC offset into a first amplified signal;
    a low pass filter to filter the baseband signal into a filtered signal;
    a second amplifier to amplify the filtered signal into a second amplified signal; and
    a coupling between an output of the first amplifier and an output of the second amplifier to subtract the second amplified signal from the first amplified signal to generate an output baseband signal having a reduced DC offset.

2. The circuit of claim 1, further comprising an automatic gain control unit coupled to the coupling to modify a gain of the circuit.

3. The circuit of claim 1, wherein the first amplifier and the second amplifier have substantially the same gain.

4. The circuit of claim 1, wherein:
    the first amplifier comprises a differential amplifier having differential output terminals;
    the second amplifier comprises a differential amplifier having differential output terminals;
    the low pass filter comprises differential input terminals coupled to receive the baseband signal and differential output terminals coupled to differential input terminals of the second amplifier to couple the filtered signal to the second amplifier, the low pass filter to block frequencies outside a small band about DC; and
    the differential output terminals of the first amplifier and the second amplifier are coupled together to comprise the coupling to cause the second amplified signal to be subtracted from the first amplified signal at the differential output terminals of the first amplifier and the second amplifier.

5. The circuit of claim 4, wherein the first amplifier and the second amplifier each comprise first and second differential output terminals, the first and second differential output terminals of the second amplifier being cross-coupled to the first and second differential output terminals of the first amplifier to combine the first amplified signal with the second amplified signal that is 180 degrees out of phase with the first amplified signal.

6. A receiver system comprising:
a substantially omnidirectional antenna to receive a wireless signal;
a converter with an input coupled to the antenna to receive the signal to convert the signal into a baseband signal having a DC offset;
a first amplifier unit coupled to the converter to receive the baseband signal, the first amplifier unit comprising:
a first amplifier to amplify the baseband signal into a first amplified signal;
a first low pass filter to filter the baseband signal into a first filtered signal;
a second amplifier to amplify the first filtered signal into a second amplified signal; and
a first coupling between an output of the first amplifier and an output of the second amplifier to subtract the second amplified signal from the first amplified signal to generate a first output baseband signal having a reduced DC offset; and
a signal processing unit coupled to the first amplifier unit to process the first output baseband signal.

7. The receiver system of claim 6, wherein the converter comprises:
a low noise amplifier with an input coupled to the antenna to receive the signal to amplify the signal into an amplified signal;
a mixer coupled to the low noise amplifier to receive the amplified signal at a port; and
a local oscillator to generate a local oscillator signal coupled to a local oscillator port of the mixer, the mixer to down convert the amplified signal into the baseband signal with the local oscillator signal at a baseband port of the mixer, the baseband port of the mixer being coupled to the first amplifier unit.

8. The receiver system of claim 6, further comprising a second amplifier unit coupled in cascade with the first amplifier unit between the first amplifier unit and the signal processing unit to receive the first output baseband signal from the first amplifier unit, the second amplifier unit comprising:
a third amplifier to amplify the first output baseband signal into a third amplified signal;
a second low pass filter to filter the first output baseband signal into a second filtered signal;
a fourth amplifier to amplify the second filtered signal into a fourth amplified signal, the fourth amplified signal having a reduced high frequency content compared to the third amplified signal; and
a second coupling between an output of the third amplifier and an output of the fourth amplifier to subtract the fourth amplified signal from the third amplified signal to generate a second output baseband signal having a reduced DC offset.

9. The receiver system of claim 8, wherein:
the first amplifier and the third amplifier each comprise a differential amplifier having differential output terminals;
the second amplifier and the fourth amplifier each comprise a differential amplifier having differential output terminals;
the first low pass filter and the second low pass filter each comprise differential input terminals coupled to receive a differential signal and differential output terminals to carry a differential signal, each of the first low pass filter and the second low pass filter further comprise first and second shunt capacitors and first and second series resistors, the first shunt capacitor being connected between a first node on a first differential line and a ground node and the second shunt capacitor being connected between a second node on a second differential line and the ground node, the first series resistor being connected between an input node on the first differential line and the first node and the second series resistor being connected between an input node on the second differential line and the second node to block frequencies outside a small band about DC;
the differential output terminals of the first amplifier and the second amplifier are cross-coupled to each other to comprise the first coupling of the first amplifier unit to combine the first amplified signal with the second amplified signal that is 180 degrees out of phase with the first amplified signal; and
the differential output terminals of the third amplifier and the fourth amplifier are cross-coupled to each other to comprise the second coupling of the second amplifier unit to combine the third amplified signal with the fourth amplified signal that is 180 degrees out of phase with the third amplified signal.

10. The receiver system of claim 8, wherein:
the first amplifier and the second amplifier are matched to have substantially the same gain; and
the third amplifier and the fourth amplifier are matched to have substantially the same gain.

11. The receiver system of claim 8, wherein the first amplifier, the second amplifier, the third amplifier, the fourth amplifier, the first low pass filter, and the second low pass filter each comprise CMOS transistors.

12. The receiver system of claim 8, further comprising:
a first automatic gain control circuit comprising a first variable impedance device connected between the first and second differential output terminals of the first amplifier unit, the first variable impedance device comprising a transistor, a peak detector, a comparator, amplifiers, and a capacitor coupled together to automatically adjust a gain of the first amplifier unit without changing a bias level of the first and second amplifiers; and
a second automatic gain control circuit comprising a second variable impedance device connected between the first and second differential output terminals of the second amplifier unit, the second variable impedance device comprising a transistor, a peak detector, a comparator, amplifiers, and a capacitor coupled together to automatically adjust a gain of the second amplifier unit without changing a bias level of the third and fourth amplifiers.

13. An amplification system to reduce DC offset in a signal, comprising:
first and second differential input terminals;
first and second differential output terminals;
a first differential amplifier coupled between the first and second differential input terminals and the first and second differential output terminals to amplify a signal received at the first and second differential input terminals to generate a first amplified differential signal at the first and second differential output terminals;
a differential low pass filter coupled to the first and second differential input terminals to filter the signal received at the first and second differential input terminals to generate a filtered differential signal at an output port of the differential low pass filter; and a coupling between first and second differential output terminals and the output port of the differential low pass filter to cause the filtered differential signal and the first amplified differential signal to subtract at the first and second differential output terminals.

14. The amplification system of claim 13, further comprising:

a second differential amplifier coupled between the output port of the differential low pass filter and the first and second differential output terminals to amplify the filtered differential signal to generate a second amplified differential signal; and wherein the coupling comprises a coupling between the second differential amplifier and the first and second differential output terminals in a manner that causes the first amplified differential signal and the second amplified differential signal to subtract at the first and second differential output terminals.

15. The amplification system of claim 14, wherein the first differential amplifier and the second differential amplifier are matched to have substantially the same gain.

16. The amplification system of claim 14, wherein first and second differential output lines of the second differential amplifier are cross-coupled to the first and second differential output terminals to comprise the coupling to combine the first amplified differential signal and the second amplified differential signal that is 180 degrees out of phase with the first amplified differential signal.

17. The amplification system of claim 14, further comprising an automatic gain control circuit comprising a variable impedance device connected between the first and second differential output terminals to change an impedance between the first and second differential output terminals based on a signal level on at least one of the first and second differential output terminals to adjust a gain of the amplification system without changing a bias level of the first differential amplifier and the second differential amplifier.

18. The amplification system of claim 14, wherein the first differential amplifier, the second differential amplifier, and the differential low pass filter are comprised of CMOS structures.

19. The amplification system of claim 13, wherein the differential low pass filter comprises first and second shunt capacitors, the first shunt capacitor being connected between a first node on a first differential line of the differential low pass filter and a ground node and the second shunt capacitor being connected between a second node on a second differential line of the differential low pass filter and the ground node, the differential low pass filter further comprising first and second series resistors, the first series resistor being connected between an input node on the first differential line of the differential low pass filter and the first node and the second series resistor being connected between an input node on the second differential line of the differential low pass filter and the second node to block frequencies outside a small band about DC.

* * * * *